United States Patent
Kawaguchi (10) Patent No.: US 9,704,768 B2
(45) Date of Patent: Jul. 11, 2017

(54) POWER SEMICONDUCTOR MODULE

(71) Applicant: Mitsubishi Electric Corporation, Tokyo (JP)

(72) Inventor: Yasuto Kawaguchi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 29 days.

(21) Appl. No.: 15/021,836

(22) PCT Filed: Dec. 17, 2013

(86) PCT No.: PCT/JP2013/083756
§ 371 (c)(1),
(2) Date: Mar. 14, 2016

(87) PCT Pub. No.: WO2015/092866
PCT Pub. Date: Jun. 25, 2015

(65) Prior Publication Data
US 2016/0233137 A1   Aug. 11, 2016

(51) Int. Cl.
*H01L 23/18* (2006.01)
*H01L 23/48* (2006.01)
(Continued)

(52) U.S. Cl.
CPC .............. *H01L 23/18* (2013.01); *H01L 23/24* (2013.01); *H01L 23/298* (2013.01);
(Continued)

(58) Field of Classification Search
None
See application file for complete search history.

(56) References Cited

U.S. PATENT DOCUMENTS

| | | |
|---|---|---|
| 6,909,181 B2 | 6/2005 | Aiba et al. |
| 7,514,777 B2 | 4/2009 | Kawaguchi et al. |
| 2008/0220567 A1* | 9/2008 | Mahler ............... H01L 21/56 438/127 |
| 2011/0249407 A1* | 10/2011 | Kawaguchi ........ H01L 23/053 361/719 |

FOREIGN PATENT DOCUMENTS

| | | |
|---|---|---|
| JP | 63-028346 B2 | 6/1988 |
| JP | 06-268100 A | 9/1994 |

(Continued)

OTHER PUBLICATIONS

An Office Action; "Notification of Reasons for Refusal" issued by the Japanese Patent Office on Jun. 14, 2016, which corresponds to Japanese Patent Application No. 2015-553261 and is related to U.S. Appl. No. 15/021,836; with partial English language translation.

(Continued)

*Primary Examiner* — Sue A Purvis
*Assistant Examiner* — Aaron Dehne
(74) *Attorney, Agent, or Firm* — Studebaker & Brackett PC (57) ABSTRACT

It is an object of the present invention to achieve reduced faults in manufacturing steps and increased reliability by relieving electric field strength of a surface of a power semiconductor chip. The present invention includes: a power semiconductor chip disposed on an insulating substrate; wiring connected to a surface conductor pattern in an element region of the power semiconductor chip; a low dielectric constant film disposed between the wiring and the peripheral region; and a sealing material formed so as to cover the insulating substrate, the power semiconductor chip, the wiring, and the low dielectric constant film. The low dielectric constant film has a dielectric constant lower than that of the sealing material.

2 Claims, 5 Drawing Sheets

(51) Int. Cl.
  *H01L 23/00*   (2006.01)
  *H01L 23/373*  (2006.01)
  *H01L 23/552*  (2006.01)
  *H01L 23/24*   (2006.01)
  *H01L 23/31*   (2006.01)
  *H01L 23/29*   (2006.01)
  *H01L 23/492*  (2006.01)
  *H01L 23/498*  (2006.01)

(52) U.S. Cl.
  CPC ...... *H01L 23/3135* (2013.01); *H01L 23/3735* (2013.01); *H01L 23/48* (2013.01); *H01L 23/492* (2013.01); *H01L 23/49811* (2013.01); *H01L 23/49838* (2013.01); *H01L 23/49894* (2013.01); *H01L 23/552* (2013.01); *H01L 24/45* (2013.01); *H01L 24/48* (2013.01); *H01L 24/29* (2013.01); *H01L 24/32* (2013.01); *H01L 24/49* (2013.01); *H01L 24/73* (2013.01); *H01L 2224/29101* (2013.01); *H01L 2224/32225* (2013.01); *H01L 2224/4554* (2013.01); *H01L 2224/4569* (2013.01); *H01L 2224/45124* (2013.01); *H01L 2224/45565* (2013.01); *H01L 2224/48091* (2013.01); *H01L 2224/49111* (2013.01); *H01L 2224/73265* (2013.01); *H01L 2224/8592* (2013.01); *H01L 2924/00014* (2013.01)

(56) References Cited

FOREIGN PATENT DOCUMENTS

| JP | 11-135540 A    | 5/1999  |
|----|----------------|---------|
| JP | 2000-150724 A  | 5/2000  |
| JP | 2000-311916 A  | 11/2000 |
| JP | 2003-152002 A  | 5/2003  |
| JP | 2008-085169 A  | 4/2008  |
| JP | 2013-016684 A  | 1/2013  |
| JP | 2013-021371 A  | 1/2013  |
| JP | 2013-191716 A  | 9/2013  |

OTHER PUBLICATIONS

International Search Report of PCT/JP2013/083756 mailed Feb. 18, 2014.

Notification of Transmittal of Copies with Translation of the International Preliminary Report on Patentability and Written Opinion of the International Searching Authority; PCT/JP2013/083756 issued on Jun. 30, 2016.

An Office Action; "Notification of Reason(s) for Refusal" issued by the Japanese Patent Office on Nov. 22, 2016, which corresponds to Japanese Patent Application No. 2015-553261 and is related to U.S. Appl. No. 15/021,836; with English language partial translation.

* cited by examiner

POWER SEMICONDUCTOR MODULE

TECHNICAL FIELD

The present invention relates to a power semiconductor module used as a power conversion device that controls electric equipment such as a motor.

BACKGROUND ART

Power semiconductor modules used as power conversion devices controlling electric equipment such as motors are subjected to a shipment screening test in manufacturing steps. The shipment screening test includes, for example, a voltage application test at a room temperature (25° C.) referred to as a cold bias stability (CBS) test (see Patent Document 1).

PRIOR ART DOCUMENT

Patent Document

Patent Document 1: Japanese Examined Patent Publication No. 63-28346 (1988)

SUMMARY OF INVENTION

Problems to be Solved by the Invention

For the CBS test serving as the shipment screening test, leakage current of a power semiconductor module increases during the test, possibly leading to breakage of the power semiconductor module.

The breakage conceivably occurs due to a local increase in the leakage current when application of high voltage causes a high electric field in the power semiconductor module, and an electric charge, which makes a distribution of electric field strength of a surface of the power semiconductor chip unstable, occurs in silicon gel. The factor in the more unstable distribution of the electric field strength is conceivably an influence of a surface state of the power semiconductor chip, a height of wire bonding, or the like.

The present invention has been made in view of the above mentioned problems, and an object thereof is to provide a power semiconductor module achieving reduced faults in the steps of manufacturing the power semiconductor module and increased reliability of the power semiconductor module by reliving electric field strength of a surface of a power semiconductor chip at the time of not only a CBS test but also application of a voltage to the power semiconductor module in general.

Means to Solve the Problems

A power semiconductor module according to one aspect of the present invention includes: an insulating substrate; a power semiconductor chip disposed on the insulating substrate; the insulating substrate having a surface on which an upper electrode is formed, the power semiconductor chip having a surface on which a surface conductor pattern is formed, the power semiconductor chip having a back surface on which a back-surface conductor pattern is formed, the power semiconductor chip having the surface in which an element region and a peripheral region surrounding the element region in plan view are defined, the upper electrode on the insulating substrate and the back-surface conductor pattern on the power semiconductor chip being connected to each other with solder therebetween, wiring connected to the surface conductor pattern in the element region of the power semiconductor chip; a low dielectric constant film disposed between the wiring and the peripheral region; and a sealing material formed so as to cover the insulating substrate, the power semiconductor chip, the wiring, and the low dielectric constant film. The low dielectric constant film has a dielectric constant lower than that of the sealing material.

A power semiconductor module according to another aspect of the present invention includes: an insulating substrate; a power semiconductor chip disposed on the insulating substrate; the insulating substrate having a surface on which an upper electrode is formed, the power semiconductor chip having a surface on which a surface conductor pattern is formed, the power semiconductor chip having a back surface on which a back-surface conductor pattern is formed, the power semiconductor chip having the surface in which an element region and a peripheral region surrounding the element region in plan view are defined, the upper electrode on the insulating substrate and the back-surface conductor pattern on the power semiconductor chip being connected to each other with solder therebetween, wiring connected to the surface conductor pattern in the element region of the power semiconductor chip; a shield substrate that is disposed between the wiring and the peripheral region and is a conductor; and a sealing material formed so as to cover the insulating substrate, the power semiconductor chip, the wiring, and the shield substrate.

A power semiconductor module according to another aspect of the present invention includes: an insulating substrate; a power semiconductor chip disposed on the insulating substrate; the insulating substrate having a surface on which an upper electrode is formed, the power semiconductor chip having a surface on which a surface conductor pattern is formed, the power semiconductor chip having a back surface on which a back-surface conductor pattern is formed, the power semiconductor chip having the surface in which an element region and a peripheral region surrounding the element region in plan view are defined, the upper electrode on the insulating substrate and the back-surface conductor pattern on the power semiconductor chip being connected to each other with solder therebetween, wiring connected to the surface conductor pattern in the element region of the power semiconductor chip; and a sealing material formed so as to cover the insulating substrate, the power semiconductor chip, and the wiring. The wiring is wired so as to extend in a direction away from the surface of the power semiconductor chip.

Effects of the Invention

According to the aspects of the present invention, the electric filed due to the wiring can be suppressed to have an influence on the surface of the power semiconductor chip. This stabilizes the electric field strength of the surface of the power semiconductor chip, so that reduced failures in the steps of manufacturing the power semiconductor module and increased reliability of the power semiconductor module can be achieved.

These and other objects, features, aspects and advantages of the present invention will become more apparent from the following detailed description of the present invention when taken in conjunction with the accompanying drawings.

DESCRIPTION OF EMBODIMENTS

Hereinafter, embodiments are described with reference to the accompanying diagrams.

In addition, terms such as a "surface," a "back surface," an "upper surface," and a "lower surface" are used in the embodiments. The terms are used to identify each surface for the sake of convenience and are not related with actual vertical and horizontal directions.

First Embodiment

Configuration

Figure 1:
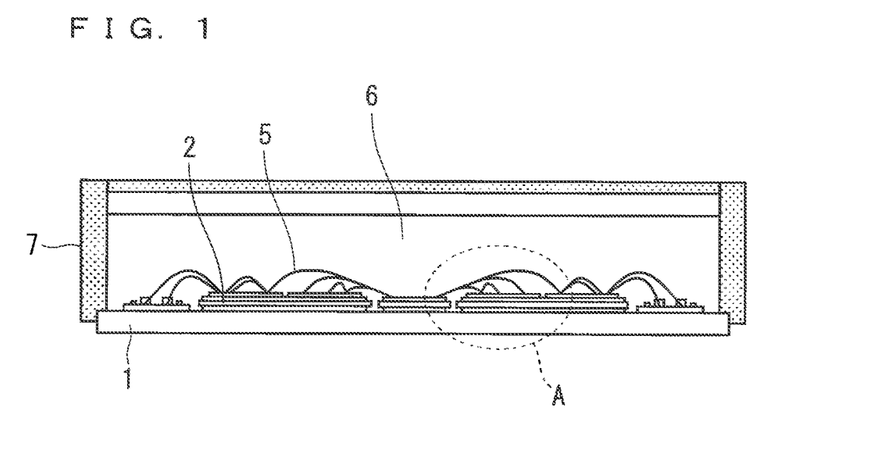
FIG. 1 is a cross-sectional view of a power semiconductor module in an embodiment.

FIG. 1 is a cross-sectional view of a whole power semiconductor module in this embodiment.

As shown in FIG. 1, the power semiconductor module includes a heat dissipation plate 1, an insulating substrate 2 bonded to the heat dissipation plate 1, aluminum wires 5 (wiring) disposed on power semiconductor chips on the insulating substrate 2, a case 7 formed so as to surround these components, and a silicon gel 6 (sealing material) that is an insulation and fills the case 7.

Figure 2:
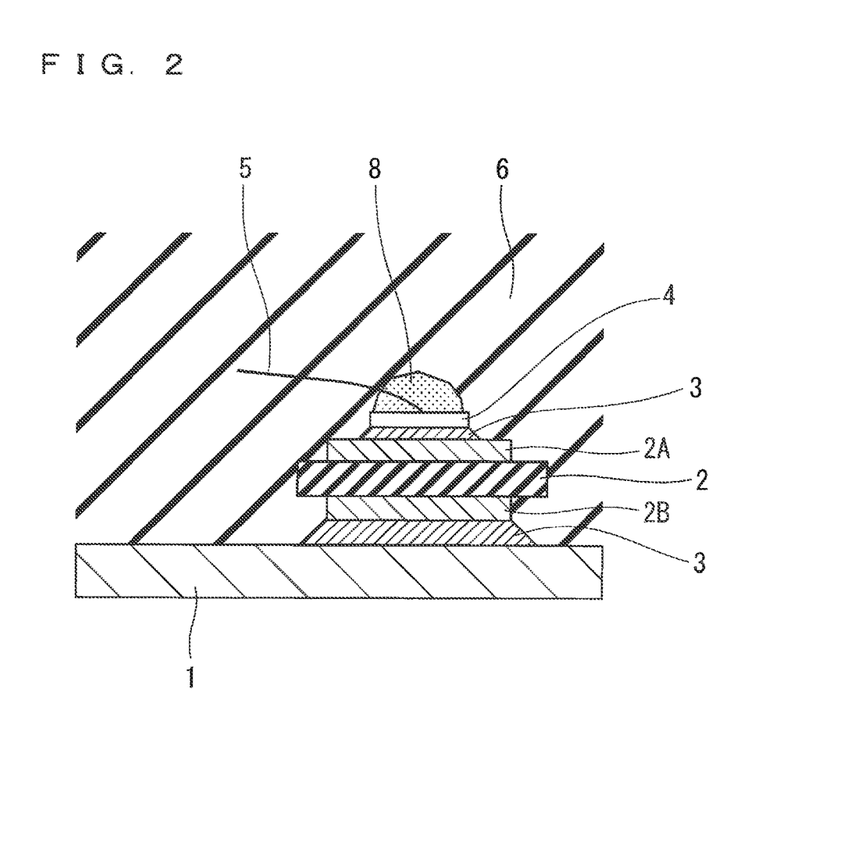
FIG. 2 is an enlarged cross-sectional view of the power semiconductor module in the embodiment.

FIG. 2 is an enlarged cross-sectional view of the power semiconductor module in this embodiment. FIG. 2 corresponds to an enlarged A portion in FIG. 1.

As shown in FIG. 2, the power semiconductor module includes the heat dissipation plate 1, the insulating substrate 2 bonded to the heat dissipation plate 1, and a power semiconductor chip 4 disposed on the insulating substrate 2.

The insulating substrate 2 includes an upper electrode 2A formed on an upper surface and a lower electrode 2B formed on a lower surface opposite to the upper surface.

The heat dissipation plate 1 and the lower electrode 2B are bonded to each other with solder 3 therebetween. The upper electrode 2A and a back-surface conductor pattern on the power semiconductor chip 4 are bonded to each other with the solder 3 therebetween.

The aluminum wires 5 are connected to a surface conductor pattern (namely, a conductor pattern disposed opposite to the back-surface conductor pattern) on the power semiconductor chip 4. A low dielectric constant film 8 is formed so as to cover the entire surface of the power semiconductor chip 4.

The low dielectric constant film 8 comprises any of silicon rubber, polyimide resin, and epoxy resin, and serves as an insulation. A dielectric constant is, for example, 2.0 to 3.0 (F/m).

Further, the silicon gel 6 being the insulation is formed so as to cover the heat dissipation plate 1, the insulating substrate 2, the power semiconductor chip 4, the aluminum wires 5, and the low dielectric constant film 8. The silicon gel 6 has a dielectric constant greater than that of the low dielectric constant film 8. In other words, the low dielectric constant film 8 has the dielectric constant lower than that of the silicon gel 6 being the sealing material.

The case 7 is filled with the silicon gel 6, which is not shown in FIG. 2.

Effects

In this embodiment, the power semiconductor module includes the insulating substrate 2 and the power semiconductor chip 4 disposed on the insulating substrate 2.

The insulating substrate 2 has the surface on which the upper electrode 2A is formed. The power semiconductor chip 4 has the surface on which the surface conductor pattern is formed. The power semiconductor chip 4 has the back surface on which the back-surface conductor pattern is formed. The power semiconductor chip 4 has the surface in which an element region 4A and a peripheral region 4B surrounding the element region 4A in plan view are defined. The upper electrode 2A on the insulating substrate 2 and the back-surface conductor pattern on the power semiconductor chip 4 are connected to each other with the solder 3 therebetween.

Further, the power semiconductor module includes the aluminum wires 5 that are the wiring and are connected to the surface conductor pattern in the element region 4A of the power semiconductor chip 4, the low dielectric constant film 8 disposed between the aluminum wires 5 and the peripheral region 4B, and the silicon gel 6 that is the sealing material and is formed so as to cover the insulating substrate 2, the power semiconductor chip 4, the aluminum wires 5, and the low dielectric constant film 8.

The low dielectric constant film 8 has the dielectric constant lower than that of the silicon gel 6.

This configuration includes the low dielectric constant film 8 disposed between the aluminum wires 5 and the peripheral region 4B, so that the low dielectric constant film 8 relieves an electric field due to the aluminum wires 5, and the electric field can be suppressed to have an influence on the surface (particularly, the peripheral region 4B) of the power semiconductor chip 4. This stabilizes electric field strength of the surface of the power semiconductor chip 4, so that reduced failures in the steps of manufacturing the power semiconductor module and increased reliability of the power semiconductor module can be achieved.

Second Embodiment

Configuration

Figure 3:
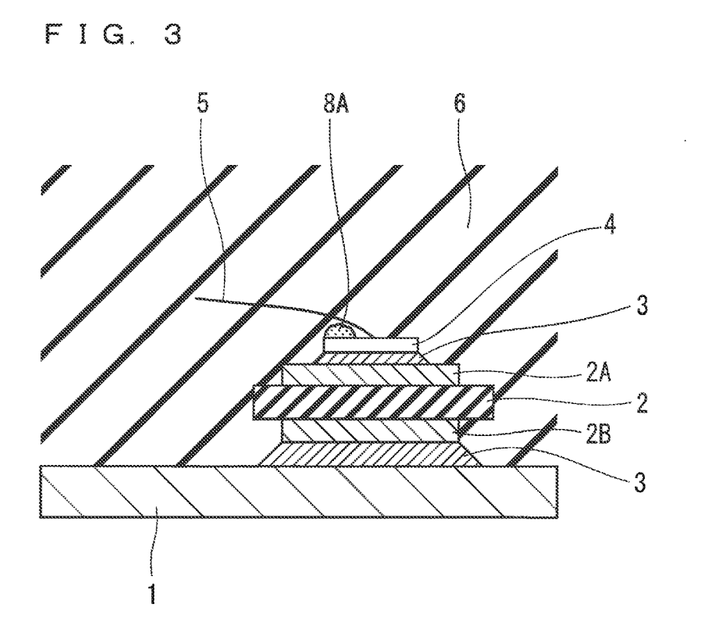
FIG. 3 is an enlarged cross-sectional view of a power semiconductor module in an embodiment.
Figure 4:
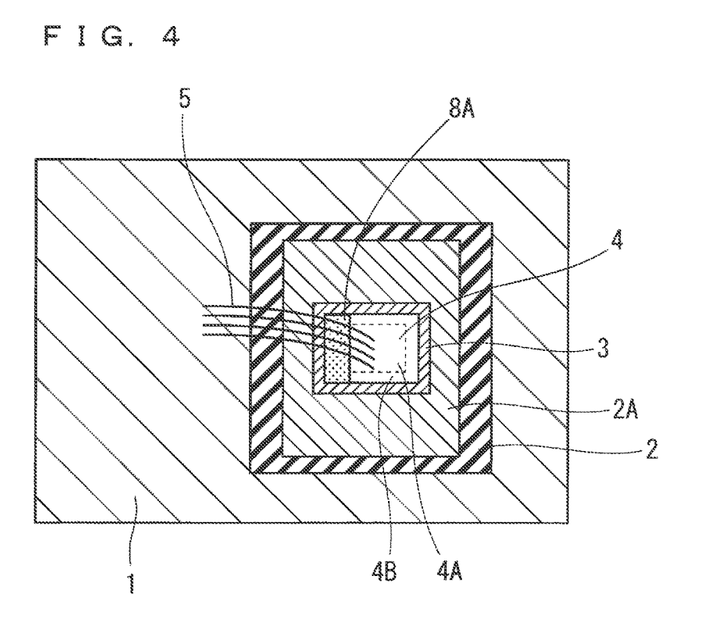
FIG. 4 is a top view of the structure in FIG. 3.

FIG. 3 is an enlarged cross-sectional view of a power semiconductor module in this embodiment. Hereinafter, the same configurations as those shown in FIG. 2 are denoted by the same references, and the same description will be omitted as appropriate. FIG. 4 is a top view of the structure in FIG. 3. It should be noted that the silicon gel 6 is omitted for the sake of simplicity.

As shown in FIGS. 3 and 4, a low dielectric constant film 8A is formed across part of the element region 4A and part of the peripheral region 4B of the surface of the power semiconductor chip 4 in the power semiconductor module, the peripheral region 4B being formed so as to surround the element region 4A in plan view. The element region herein is referred to as a region that mainly functions as an active element.

More specifically, the low dielectric constant film 8A is formed so as to cover at least part of the peripheral region 4B overlapping wiring paths of the aluminum wires 5 in plan view.

The low dielectric constant film 8A comprises any of silicon rubber, polyimide resin, and epoxy resin, and serves as an insulation.

Effects

In this embodiment, the low dielectric constant film 8A is formed so as to cover part of the peripheral region 4B of the surface of the power semiconductor chip 4 overlapping the wiring paths of the aluminum wires 5 in plan view.

This configuration can suppress an influence of an electric field due to the aluminum wires 5 particularly on the peripheral region 4B. This stabilizes electric field strength of the surface of the power semiconductor chip 4, so that reduced failures in the steps of manufacturing the power semiconductor module and increased reliability of the power semiconductor module can be achieved.

Third Embodiment

Configuration

Figure 5:
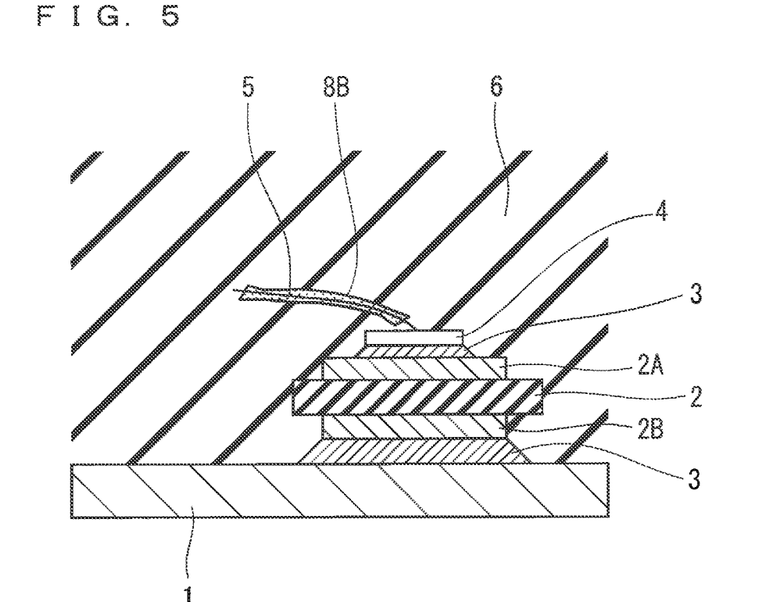
FIG. 5 is an enlarged cross-sectional view of a power semiconductor module in an embodiment.

FIG. 5 is an enlarged cross-sectional view of a power semiconductor module in this embodiment. Hereinafter, the same configurations as those shown in FIG. 2 are denoted by the same references, and the same description will be omitted as appropriate.

As shown in FIG. 5, a low dielectric constant film 8B is formed so as to cover each surface of the aluminum wires 5 in the power semiconductor module.

The low dielectric constant film 8B is more preferably formed so as to cover at least part of the aluminum wires 5 overlapping the peripheral region 4B of the surface of the power semiconductor chip 4 in plan view.

The low dielectric constant film 8B comprises any of silicon rubber, polyimide resin, and epoxy resin, and serves as an insulation.

Effects

In this embodiment, the low dielectric constant film 8B is formed so as to cover each of the surfaces of the aluminum wires 5 being the wiring.

This configuration suppresses an electric filed due to the aluminum wires 5 by the low dielectric constant film 8B covering each of the surfaces of the aluminum wires 5, and an influence of the electric field on electric field strength of the surface of the power semiconductor chip 4 can be relieved. This stabilizes the electric field strength of the surface of the power semiconductor chip 4, so that reduced failures in the steps of manufacturing the power semiconductor module and increased reliability of the power semiconductor module can be achieved.

Fourth Embodiment

Configuration

Figure 6:
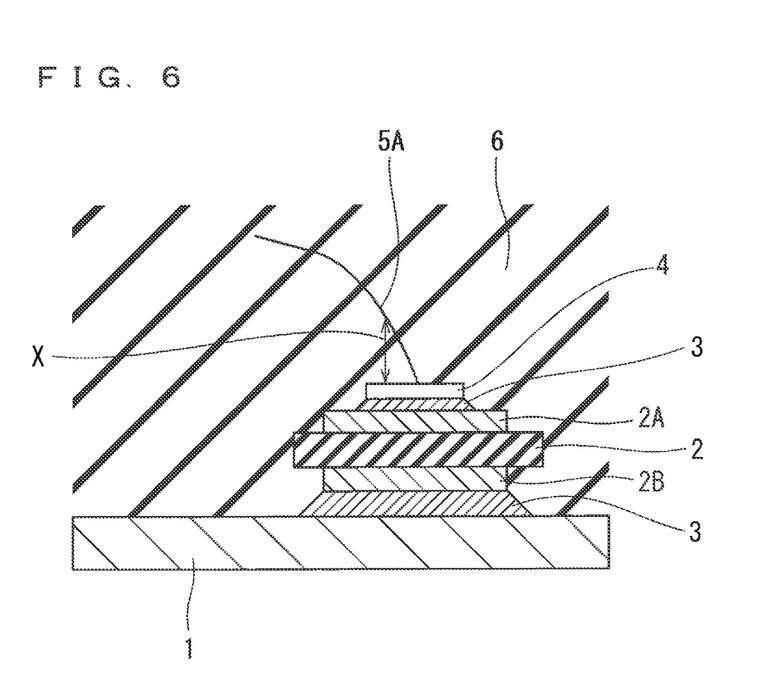
FIG. 6 is an enlarged cross-sectional view of a power semiconductor module in an embodiment.

FIG. 6 is an enlarged cross-sectional view of a power semiconductor module in this embodiment. Hereinafter, the same configurations as those shown in FIG. 2 are denoted by the same references, and the same description will be omitted as appropriate.

As shown in FIG. 6, a low dielectric constant film is not provided in the power semiconductor module. Moreover, aluminum wires 5A are wired more upwardly than those in the other embodiments above.

In other words, a distance X between the peripheral region 4B of the surface of the power semiconductor chip 4 and the aluminum wires 5A is greater than that in the other embodiments above. Specifically, a distance (a distance in a vertical direction in FIG. 6) between the peripheral region 4B and the aluminum wires 5A is preferably greater than or equal to 3 mm.

Effects

In this embodiment, the power semiconductor module includes the insulating substrate 2 and the power semiconductor chip 4 disposed on the insulating substrate 2.

The insulating substrate 2 has the surface on which the upper electrode 2A is formed. The power semiconductor chip 4 has the surface on which the surface conductor pattern is formed. The power semiconductor chip 4 has the back surface on which the back-surface conductor pattern is formed. The power semiconductor chip 4 has the surface in which the element region 4A and the peripheral region 4B surrounding the element region 4A in plan view are defined. The upper electrode 2A on the insulating substrate 2 and the back-surface conductor pattern on the power semiconductor chip 4 are connected to each other with the solder 3 therebetween.

The power semiconductor module includes the aluminum wires 5A connected to the surface conductor pattern in the element region 4A of the power semiconductor chip and the silicon gel 6 formed so as to cover the insulating substrate 2, the power semiconductor chip 4, and the aluminum wires 5A.

The aluminum wires 5A are wired so as to extend in a direction away from the surface of the power semiconductor chip 4.

This configuration increases the distance between the aluminum wires 5A and the peripheral region 4B, and an electric field due to the aluminum wires 5A can be suppressed to have an influence on the surface (particularly, the peripheral region 4B) of the power semiconductor chip 4. This stabilizes electric field strength of the surface of the power semiconductor chip 4, so that reduced failures in the steps of manufacturing the power semiconductor module and increased reliability of the power semiconductor module can be achieved.

Fifth Embodiment

Configuration

Figure 7:
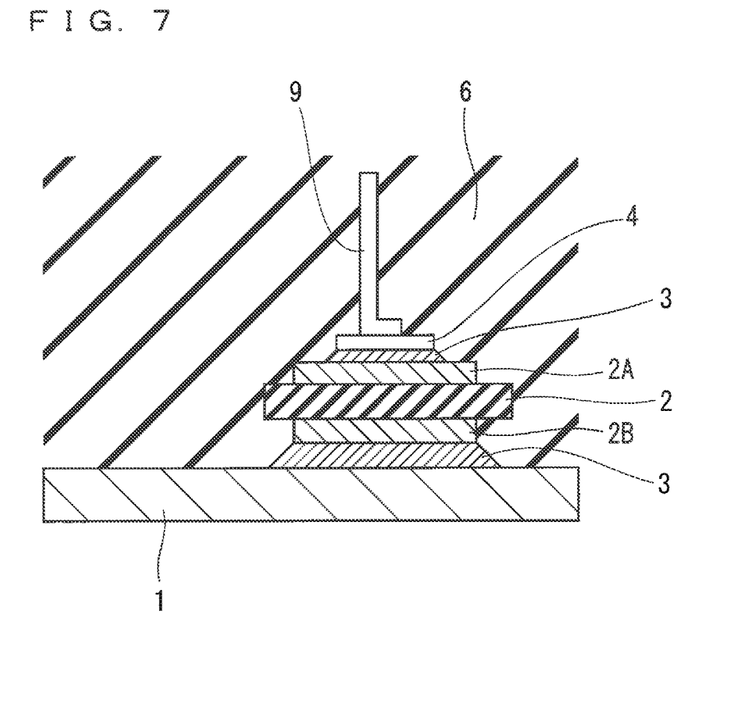
FIG. 7 is an enlarged cross-sectional view of a power semiconductor module in an embodiment.

FIG. 7 is an enlarged cross-sectional view of a power semiconductor module in this embodiment. Hereinafter, the same configurations as those shown in FIG. 2 are denoted by the same references, and the same description will be omitted as appropriate.

As shown in FIG. 7, a low dielectric constant film is not provided in the power semiconductor module. The surface conductor pattern on the power semiconductor chip 4 is directly connected to a copper electrode 9 instead of aluminum wires, and the copper electrode 9 is formed so as to extend upwardly.

In other words, a distance between the peripheral region 4B of the surface of the power semiconductor chip 4 and the copper electrode 9 is greater than that in the first to third embodiments above.

In addition, the direction in which the copper electrode 9 extends is preferably orthogonal to the surface of the power semiconductor chip 4.

Effects

In this embodiment, the wiring comprises the copper electrode 9 directly connected to the surface conductor pattern on the power semiconductor chip 4.

This configuration increases the distance between the copper electrode 9 and the peripheral region 4B, and an electric field due to the copper electrode 9 can be suppressed to have an influence on the surface (particularly, the peripheral region 4B) of the power semiconductor chip 4. This stabilizes electric field strength of the surface of the power semiconductor chip 4, so that reduced failures in the steps of manufacturing the power semiconductor module and increased reliability of the power semiconductor module can be achieved.

Sixth Embodiment

Configuration

Figure 8:
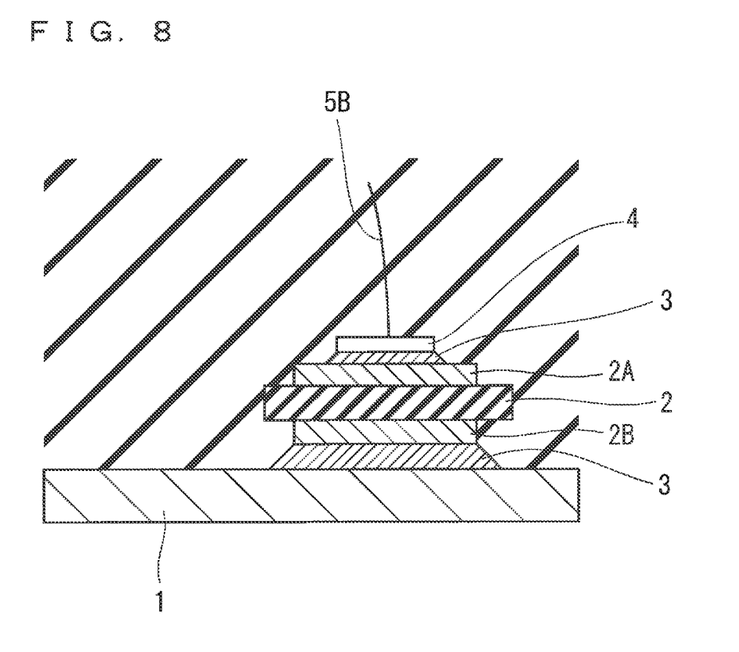
FIG. 8 is an enlarged cross-sectional view of a power semiconductor module in an embodiment.

FIG. 8 is an enlarged cross-sectional view of a power semiconductor module in this embodiment. Hereinafter, the same configurations as those shown in FIG. 2 are denoted by the same references, and the same description will be omitted as appropriate.

As shown in FIG. 8, a low dielectric constant film is not provided in the power semiconductor module. Aluminum wires 5B are connected to the surface conductor pattern on the power semiconductor chip 4 and formed so as to extend upwardly.

In other words, a distance between the peripheral region 4B of the surface of the power semiconductor chip 4 and the aluminum wires 5B is greater than that in the first to third embodiments above.

In addition, the direction in which the aluminum wires 5B extend is preferably orthogonal to the surface of the power semiconductor chip 4.

Effects

In this embodiment, the aluminum wires 5B are wired so as to extend in the direction orthogonal to the surface of the power semiconductor chip 4.

This configuration increases the distance between the aluminum wires 5B and the peripheral region 4B, and an electric field due to the aluminum wires 5B can be suppressed to have an influence on the surface (particularly, the peripheral region 4B) of the power semiconductor chip 4. This stabilizes electric field strength of the surface of the power semiconductor chip 4, so that reduced failures in the steps of manufacturing the power semiconductor module and increased reliability of the power semiconductor module can be achieved.

Seventh Embodiment

Configuration

Figure 9:
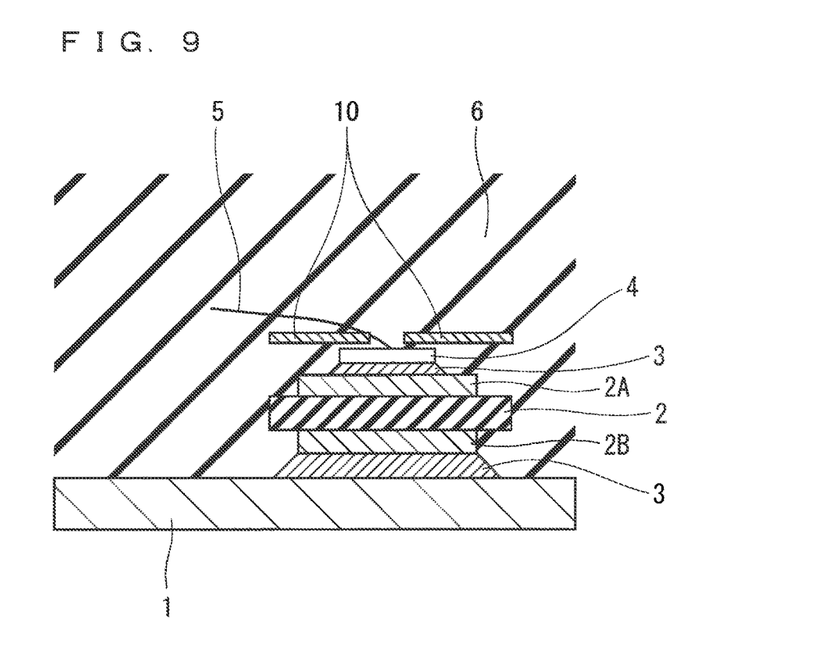
FIG. 9 is an enlarged cross-sectional view of a power semiconductor module in an embodiment.
Figure 10:
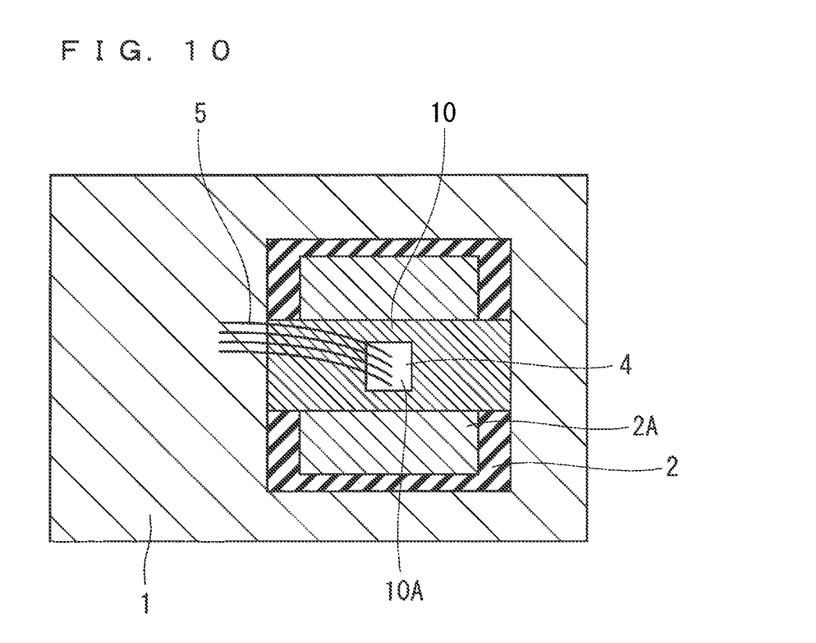
FIG. 10 is a top view of the structure in FIG. 9.

FIG. 9 is an enlarged cross-sectional view of a power semiconductor module in this embodiment. Hereinafter, the same configurations as those shown in FIG. 2 are denoted by the same references, and the same description will be omitted as appropriate. FIG. 10 is a top view of the structure in FIG. 9. It should be noted that the silicon gel 6 is omitted for the sake of simplicity.

As shown in FIGS. 9 and 10, a shield substrate 10 is formed across part of the power semiconductor chip 4 and part of the insulating substrate 2 in the power semiconductor module. FIG. 10 shows the shield substrate 10 having an opening 10A for wiring the aluminum wires 5.

The shield substrate 10 is more preferably formed across at least part of the peripheral region 4B of the power semiconductor chip 4 overlapping the wiring paths of the aluminum wires 5 in plan view.

The shield substrate 10 is a conductor and comprises, for example, copper.

Effects

In this embodiment, the power semiconductor module includes the insulating substrate 2 and the power semiconductor chip 4 disposed on the insulating substrate 2.

The insulating substrate 2 has the surface on which the upper electrode 2A is formed. The power semiconductor chip 4 has the surface on which the surface conductor pattern is formed. The power semiconductor chip 4 has the back surface on which the back-surface conductor pattern is formed. The power semiconductor chip 4 has the surface in which the element region 4A and the peripheral region 4B surrounding the element region 4A in plan view are defined. The upper electrode 2A on the insulating substrate 2 and the back-surface conductor pattern on the power semiconductor chip 4 are connected to each other with the solder 3 therebetween.

Further, the power semiconductor module includes the aluminum wires 5 connected to the surface conductor pattern in the element region 4A of the power semiconductor chip 4, the shield substrate 10 that is disposed between the aluminum wires 5 and the peripheral region 4B and is the conductor, and the silicon gel 6 that is the sealing material and is formed so as to cover the insulating substrate 2, the power semiconductor chip 4, the aluminum wires 5, and the shield substrate 10.

This configuration includes the shield substrate 10 that is disposed between the aluminum wires 5 and the peripheral region 4B and is the conductor, so that the shield substrate 10 shields an electric field due to the aluminum wires 5, and the electric field can be suppressed to have an influence on the surface (particularly, the peripheral region 4B) of the power semiconductor chip 4. This stabilizes electric field strength of the surface of the power semiconductor chip 4, so that reduced failures in the steps of manufacturing the power semiconductor module and increased reliability of the power semiconductor module can be achieved.

Although the materials of the respective components, the conditions of implementation, and the like, are described in the embodiments above, the foregoing description is illustrative and not restrictive. Thus, the numerous modifications and variations (including arbitrary variations or omissions of the components and free combinations of the different embodiments above) can be devised within the scope of the present invention.

DESCRIPTION OF NUMERALS 1 heat dissipation plate; 2 insulating substrate; 2A upper electrode; 2B lower electrode; 3 solder; 4 power semiconductor chip; 4A element region; 4B peripheral region; 5, 5A, 5B aluminum wire; 6 silicon gel; 7 case; 8, 8A, 8B low dielectric constant film; 9 copper electrode; 10 shield substrate; 10A opening.

The invention claimed is:
1. A power semiconductor module, comprising:
an insulating substrate;
a power semiconductor chip disposed on said insulating substrate;
   said insulating substrate having a surface on which an upper electrode is formed,
   said power semiconductor chip having a surface on which a surface conductor pattern is formed,
   said power semiconductor chip having a back surface on which a back-surface conductor pattern is formed,
   said power semiconductor chip having the surface in which an element region and a peripheral region surrounding said element region in plan view are defined,
   said upper electrode on said insulating substrate and said back-surface conductor pattern on said power semiconductor chip being connected to each other with solder therebetween,
wiring connected to said surface conductor pattern in said element region of said power semiconductor chip;
a low dielectric constant film disposed between said wiring and said peripheral region and only above said surface of said power semiconductor chip; and
a sealing material formed so as to cover said insulating substrate, said power semiconductor chip, said wiring, and said low dielectric constant film,
wherein said low dielectric constant film has a dielectric constant lower than that of said sealing material, and
said low dielectric constant film is formed so as to cover only a part of said peripheral region of the surface of said power semiconductor chip overlapping a wiring path of said wiring in plan view.

2. A power semiconductor module, comprising:
an insulating substrate;
a power semiconductor chip disposed on said insulating substrate;
   said insulating substrate having a surface on which an upper electrode is formed,
   said power semiconductor chip having a surface on which a surface conductor pattern is formed,
   said power semiconductor chip having a back surface on which a back-surface conductor pattern is formed,
   said power semiconductor chip having the surface in which an element region and a peripheral region surrounding said element region in plan view are defined,
   said upper electrode on said insulating substrate and said back-surface conductor pattern on said power semiconductor chip being connected to each other with solder therebetween,
wiring connected to said surface conductor pattern in said element region of said power semiconductor chip;
a low dielectric constant film disposed between said wiring and said peripheral region; and
a sealing material formed so as to cover said insulating substrate, said power semiconductor chip, said wiring, and said low dielectric constant film,
wherein said low dielectric constant film has a dielectric constant lower than that of said sealing material, and
said low dielectric constant film is formed so as to cover only a surface of said wiring.

* * * * *